(12) United States Patent
Sawle

(10) Patent No.: US 7,417,312 B2
(45) Date of Patent: Aug. 26, 2008

(54) USE OF SOLDER PASTE FOR HEAT DISSIPATION

(75) Inventor: Andrew Neil Sawle, East Grinstead (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/406,690

(22) Filed: Apr. 19, 2006

(65) Prior Publication Data

US 2006/0267183 A1 Nov. 30, 2006

Related U.S. Application Data

(60) Provisional application No. 60/674,257, filed on Apr. 22, 2005.

(51) Int. Cl.
*H01L 23/34* (2006.01)
(52) U.S. Cl. .............. 257/707; 257/E23.08; 257/692; 257/717; 257/775
(58) Field of Classification Search .............. 257/707
See application file for complete search history.

(56) References Cited

U.S. PATENT DOCUMENTS

| | | | | |
|---|---|---|---|---|
| 5,411,602 | A | * | 5/1995 | Hayes .................. 148/23 |
| 5,729,432 | A | | 3/1998 | Shim et al. |
| 5,840,432 | A | * | 11/1998 | Hirai et al. .................. 428/570 |
| 6,563,712 | B2 | * | 5/2003 | Akram et al. .............. 361/719 |
| 6,889,433 | B1 | | 5/2005 | Enomoto et al. |
| 7,159,313 | B2 | | 1/2007 | Sathe et al. |
| 2002/0005247 | A1 | | 1/2002 | Graham et al. |
| 2002/0114726 | A1 | | 8/2002 | Soga et al. |
| 2002/0155642 | A1 | | 10/2002 | Noquil et al. |
| 2003/0222344 | A1 | | 12/2003 | Hosoyamada et al. |
| 2005/0046032 | A1 | * | 3/2005 | Naruse et al. ............... 257/772 |
| 2005/0093164 | A1 | | 5/2005 | Standing .................. 257/772 |

OTHER PUBLICATIONS

International Search Report for PCT/US 06/15326 dated Jan. 11, 2007.
U.S. Appl. No. 10/970,165, filed Oct. 21, 2004.
U.S. Appl. No. 10/970,557, filed Oct. 21, 2004.
U.S. Appl. No. 11/893,237, filed Aug. 15, 2007.

* cited by examiner

*Primary Examiner*—Tu-Tu V Ho
(74) *Attorney, Agent, or Firm*—Ostrolenk, Faber, Gerb & Soffen, LLP

(57) ABSTRACT

A circuit board includes at least one trace having at least one heat spreader disposed thereon, the heater spreader being formed of a solidified paste, such as a paste that includes a mixture of binder particles and filler particles, or a solder paste. As an example, the heater spreader may be configured to increase a cross-sectional area of a portion of the trace, thereby improving heat flow along that portion of the trace. Alternatively, the heater spreader may be configured to increase the surface area of the trace, thereby increasing heat dissipation from the circuit board. As another example, the heat spreader may be disposed between the trace and a semiconductor device and thereby function as a heat sink for the device.

13 Claims, 4 Drawing Sheets

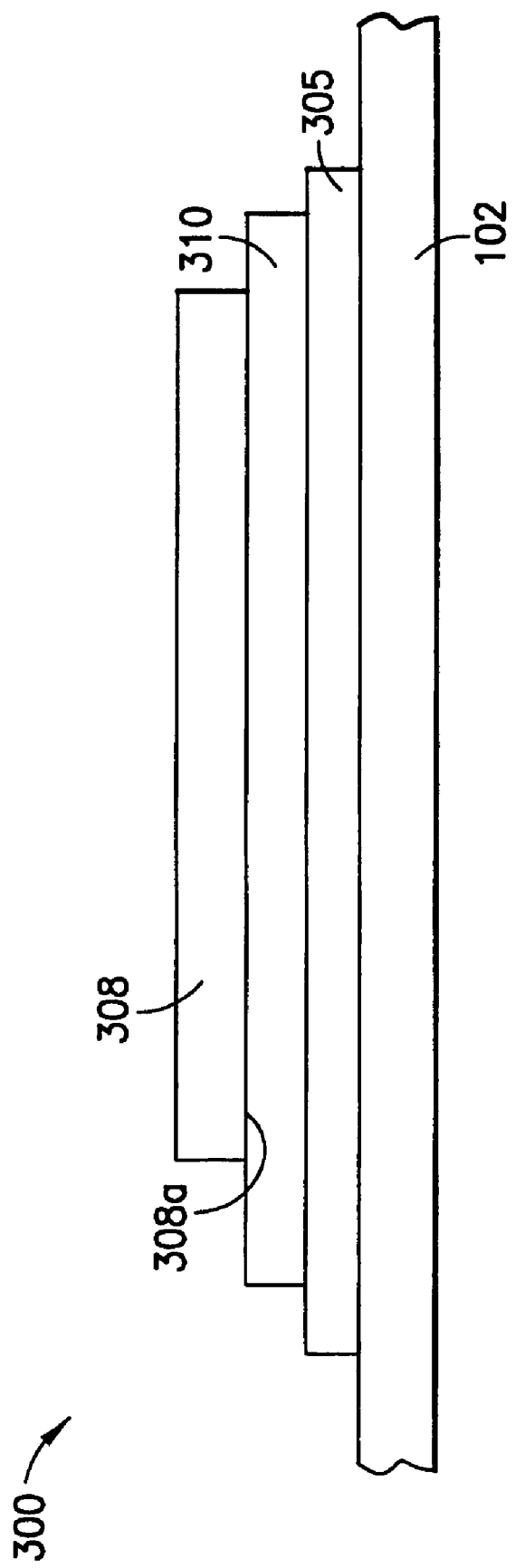

USE OF SOLDER PASTE FOR HEAT DISSIPATION

RELATED APPLICATIONS

This application is based on and claims priority to U.S. Provisional Application No. 60/674,257, filed on Apr. 22, 2005, by Andrew N. Sawle, entitled, "THE USE OF CONNECTRON™ PRINTABLE PASTE FOR DIRECTIONAL HEATSPREADING," the contents of which are herein incorporated by reference.

BACKGROUND OF THE INVENTION

1. Field of the Invention

This invention relates to circuit board heat dissipation and more specifically, relates to the use of solder paste to spread and dissipate heat on a circuit board.

2. Description of the Art

A substantial issue facing circuit board designers is the ability to efficiently dissipate/remove the heat generated by the circuit board devices to the surrounding area. For example, with respect to power circuits, the more efficiently the heat is removed, the more power that can be dissipated for a given rise in device junction temperature. One method designers currently use to remove the heat generated by devices is to dump the heat into the circuit board on which the devices are mounted and to thereafter use the larger surface area of the circuit board to dissipate the heat to the surrounding area. Nonetheless, this method of heat dissipation has several limitations.

First, as is readily understood, as the size of a circuit board increases, the exposed surface area of the circuit board also increases, thereby allowing for greater heat dissipation to the surrounding area. Accordingly, a circuit board is often sized to obtain adequate heat dissipation for the devices mounted thereon. However, at times, cost and space restrictions may prevent a circuit board from being adequately sized to obtain the necessary heat dissipation, even through only a small amount of additional surface area may be needed. In these cases, additional heatsinking and/or forced-air cooling may be required, both of which can be costly.

A second limitation with using a circuit board to dissipate heat is that the heat may not spread evenly across the circuit board, thereby causing the heat to not efficiently dissipate and resulting in the formation of hot spots on the board around hot devices. In order to prevent the formation of hot spots and to spread heat away from hot devices and across the circuit board, the copper weight of the top, bottom, and/or intermediate copper traces of the circuit board may be increased or the width of the copper traces on the surface of the circuit board may be increased. In general, each of these methods increases the cross-sectional area of the traces, thereby improving the ability of the traces to conduct heat away from the devices. In many cases, however, it is not possible to increase the weight and/or width of the traces.

For example, the motherboards found in notebook computers typically use only one-ounce copper traces on the surface of the boards. However, one-ounce copper traces are not sufficient for spreading heat away from power devices, for example. Accordingly, thick copper traces are required in the areas surrounding the power devices. However, increasing the copper weight of the traces around the power devices also means increasing the copper weight of the traces across the whole motherboard, even in areas where increased-weight traces may not be needed. Accordingly, this method adds additional cost, which may be prohibitive.

Accordingly, it is desirable to provide a mechanism that allows for improved heat spreading along a circuit board and away from hot devices and that allows for improved heat dissipation from the circuit board to the surrounding area.

BRIEF SUMMARY OF THE INVENTION

According to an embodiment of the invention, a circuit board includes one or more traces formed on a surface thereof and includes one or more semiconductor devices mounted to the circuit board and in thermal contact with the traces. The circuit board also includes one or more heat spreaders formed directly on the top surfaces of one or more of the traces. According to an embodiment of the invention, the heat spreaders may be formed in a localized and selective fashion in portions/areas along the traces in which hot spots may form. For example, the heat spreaders may be formed along the traces in areas laterally displaced from/adjacent to the semiconductor devices. According to an embodiment of the invention, the heat spreaders supplement the amount of high thermal conductivity material constituting the traces in the portions/areas of the traces in which the heat spreaders are formed, thereby increasing the amount of material available for the conduction of heat. In this way, the heat spreaders of the present invention assist the traces in spreading heat away from areas in which hot spots may form, thereby improving the dissipation of heat. According to an embodiment of the invention, the heat spreaders may also be shaped/patterned to guide/induce the flow of heat in certain directions, such as away from hot spots and towards cooler areas of the circuit board.

According to an embodiment of the invention, the heat spreaders may be formed from a paste that is applied to the surfaces of the traces and heated/reflown, thereby resulting in solidified structures that constitute the heat spreaders. According to a preferred embodiment of the invention, the paste includes a mixture of binder particles and dispersed filler particles, with the binder particles preferably having a lower melting temperature than the filler particles. In addition, the proportion of binder particles to filler particles is preferably such that as the binder particles melt, there is not sufficient liquidous to flow but there is sufficient liquidous to fuse/glue the filler particles together, thereby allowing for the formation of solidified structures that have substantially the same shape as the deposited paste. As a result, a paste of this form allows for the formation of localized heat spreaders of desired shapes and sizes, and that may be relatively tall and may have relatively flat top and side surfaces.

According to another embodiment of the invention, the paste used to form the heat spreaders may be a solder paste of any type known in the art that does not include filler particles, as described above. As an example, the solder paste may be "board-attach solder paste" that is used to adhere devices to the traces.

According to another embodiment of the invention, a circuit board includes one or more traces formed on a surface thereof and further includes one or more heat spreaders formed atop the traces. According to this embodiment of the invention, the one or more heat spreaders formed atop a given trace supplement the amount of high thermal conductivity material constituting the trace, as similarly described above. According to this embodiment of the invention, however, the one or more heat spreaders formed on a given trace are now arranged and configured to increase the overall surface area of the trace, thereby increasing the overall surface area of the circuit board and thereby allowing the circuit board to dissipate more heat to the surrounding area than would otherwise be possible. Similar to above, the heat spreaders may be formed from a solidified paste, including a paste that includes a mixture of binder and filler particles or any solder paste, such as board-attach solder paste, known in the art that does not include filler particles.

According to another embodiment of the invention, the heat spreaders may be configured to not only increase the overall surface area of a circuit board, but may also be configured and arranged so as to align with airflow, such as forced air cooling, to further improve the cooling of the board.

According to another embodiment of the invention, a circuit board includes a trace, a heat spreader disposed on the trace, and a semiconductor device disposed atop the heat spreader. Here, the heat spreader functions as both a micro heat sink for the device, drawing heat away from the device, and also as a heat spreader, to reduce the formation of a hot spot around the device. According to an embodiment of the invention, the heat spreader may be formed from a solidified paste as described above. Notably, a heat spreader of the present embodiment of the invention may be formed in a selective and localized fashion atop a circuit board for those devices that may generate substantial heat, for example.

Other features and advantages of the present invention will become apparent from the following description of the invention, which refers to the accompanying drawings.

BRIEF DESCRIPTION OF THE DRAWINGS

FIG. 3 shows a side view of a portion of a semiconductor device disposed atop a heat spreader and circuit board according to another embodiment of the invention.

DETAIL DESCRIPTION OF THE INVENTION

Figure 1A:
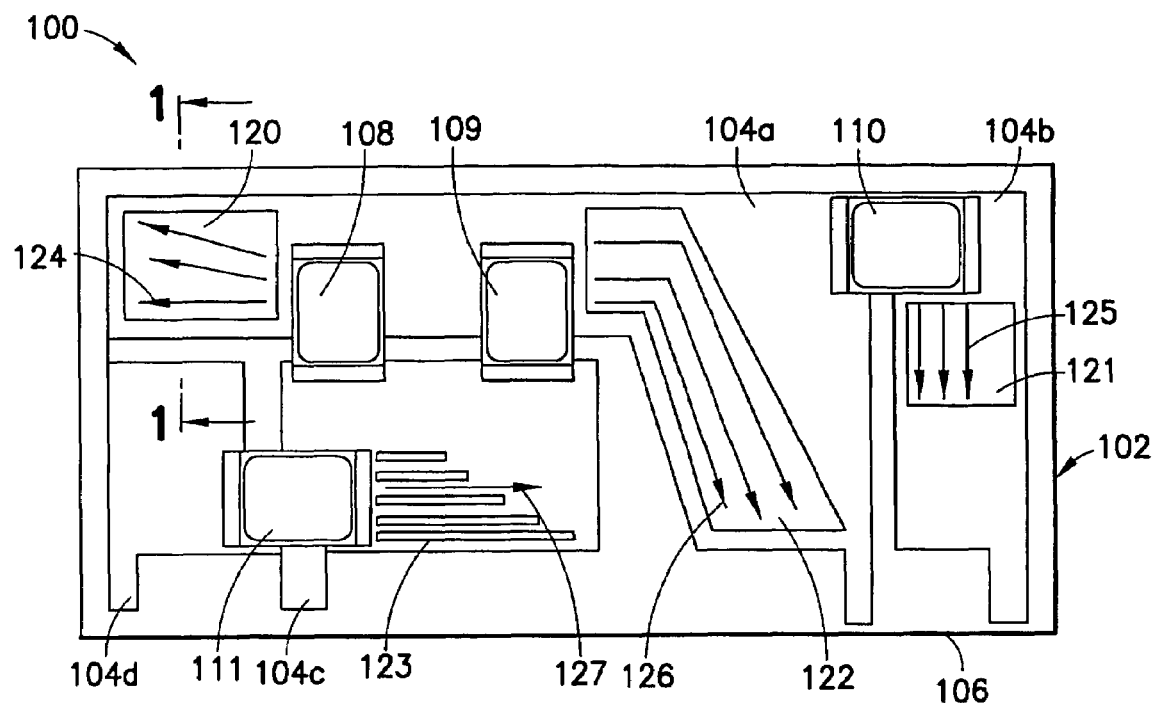
FIG. 1A shows a top view of a circuit board that includes a plurality of heat spreaders according to an embodiment of the invention, the heat spreaders being configured to improve heat flow along the circuit board.
Figure 1B:
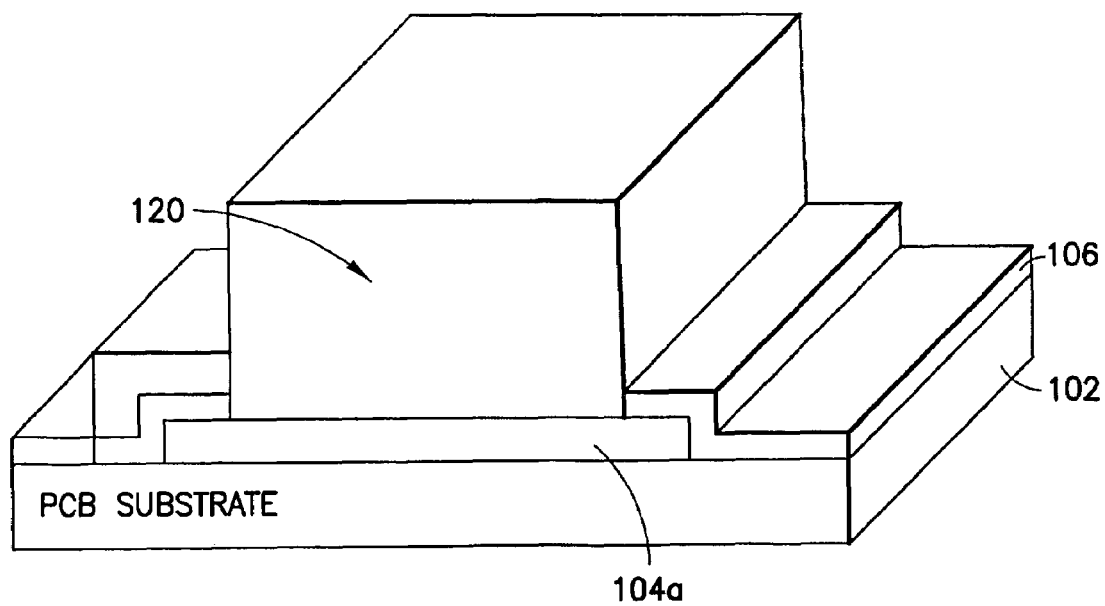
FIG. 1B shows a side perspective view of a heat spreader as seen along line 1 of FIG. 1A, according to an embodiment of the invention.

Referring to FIGS. 1A and 1B, there is shown respectively a top view of a printed circuit board 100 and a side perspective view of a portion of this circuit board, as seen along line 1 of FIG. 1A, according to an embodiment of the invention. Circuit board 100 includes a substrate 102 made of any suitable material known in the art. Formed on the top surface of substrate 102 are one or more traces made of copper or the like, such as traces 104a-104d. One skilled in the art will recognize that substrate 102 may also include intermediate traces formed within the substrate and/or traces formed on the bottom surface of the substrate. One skilled in the art will also recognize that the present invention is not limited to the number, shape, and/or configuration of the traces shown in FIG. 1A. Circuit board 100 may also include a solder mask layer 106 formed over the top surface of substrate 102 and over portions of the top surfaces of traces 104a-104d as is known in the art.

Circuit board 100 also includes one or more devices, such as devices 108, 109, 110, and 111, which may be, for example, power semiconductor devices. Devices 108-111 are mounted to circuit board 100 and are in thermal contact with one or more traces 104a-104d of the circuit board. In general, this thermal contact may be the result of one or more electrodes of a device being in electrical contact with a trace. Alternatively, an electrically non-conductive surface of a device may be mounted directly to a trace. As another alternative, a heat sink may be disposed between a device and a trace. One skilled in the art will recognize that other configurations are possible.

According to an embodiment of the invention, circuit board 100 also includes one or more heat spreaders, such as heat spreaders 120, 121, 122, and 123, formed directly on the top surfaces of one or more of traces 104a-104d. For example, openings may be formed within solder mask layer 106 atop traces 104a-104d, thereby defining areas that are to receive the heat spreaders. Thereafter, the heat spreaders may be formed through these opening atop the traces. Note that if circuit board 100 also includes traces formed on the bottom surface thereof, heat spreaders of the present invention may also be formed atop these traces.

According to an embodiment of the invention, heat spreaders 120-123 are formed of a thermally conductive material that supplements the amount of high thermal conductivity material constituting the traces in the portions/areas of the traces in which the heat spreaders are formed, thereby increasing the amount of material available for the conduction of heat. Specifically, in circuit board 100, devices 108-111 dump/transfer heat to traces 104a-104d in the conventional manner, with the traces thereafter dissipating the heat by spreading the heat away from the devices. However, as described above, traces 104a-104d may not have sufficient size (i.e., sufficient cross sectional area) to effectively and evenly spread heat away from the devices, thereby resulting in the formation of hot spots around the devices. According to an embodiment of the invention, heat spreaders 120-123 are formed on the traces to increase the cross-sectional area of the traces, thereby increasing the amount of high thermal conductivity material available for thermal conduction. In this way, the heat spreaders of the present invention assist the traces in spreading heat away from the devices and thereby improving the dissipation of heat.

According to an embodiment of the invention, one or more of heat spreaders 120-123 may be formed in a localized and selective fashion in portions/areas along the traces in which hot spots may form. In this way, the cross-sectional area of a given trace available for heat flow may be increased in a localized and selective fashion. For example, as shown by heat spreaders 120-123 in FIG. 1A, the heat spreaders may be formed along the traces in areas that are laterally displaced from/adjacent to devices 108-111, for example. Similarly, one skilled in the art will recognize that the heat spreaders may be formed in a localized and selective fashion along other portions of the traces. In addition, one skilled in the art will also recognize that one or more of heat spreaders 120-123 do not need to be formed in a localized and selective fashion and may be formed over the entire top surface areas or substantially the entire top surface areas of the traces, for example.

According to an embodiment of the invention, one or more of heat spreaders 120-123 may also be shaped/patterned in order to guide/induce the flow of heat in certain directions, such as away from hot spots and towards cooler areas of the circuit board. For example, as shown in FIG. 1A, heat spreaders 120-123 may be shaped/formed so as to induce the flow of heat as shown by arrows 124, 125, 126, and 127. In order to obtain this directional flow, the heat spreaders of the present invention may have varying sizes and shapes, including solid block shapes (e.g., heat spreaders 120 and 125), multiple parallel strips (e.g., heat spreader 123), and irregular shapes (e.g., heat spreader 122). One skilled in the art will recognize that other shapes may be used.

One skilled in the art will also recognize that the present invention is not limited to the number and or formation of heat spreaders as shown in FIG. 1A. One skilled in the art will further recognize that any given trace on a circuit board may include a single heat spreader of the present invention, multiple heat spreaders, or no heat spreaders.

According to an embodiment of the invention, heat spreaders 120-123 are formed from a paste that is applied through printing, for example, to the surfaces of the traces and heated/reflown, thereby resulting in solidified structures that constitute the heat spreaders. Preferably, the paste is thermally conductive and may also be electrically conductive. In addition, the paste is preferably of a form such that once reflown, the resulting solidified structures/heat spreaders self-adhere to the traces, thereby forming integral structures with the traces.

According to a preferred embodiment of the invention, the paste includes a mixture of binder particles and dispersed filler particles, with the binder particles preferably having a lower melting temperature than the filler particles. Preferably, the binder particles and filler particles are thermally conductive and may also be electrically conductive. As an example, the binder particles may be solder, such as tin-lead solder, tin-silver solder, tin-silver-copper solder, or high lead solder. As an example, the filler particles may be copper, nickel, tin-silver, or one material coated with another material. Note that the mixture may also include a solder flux material.

In order to form a solidified structure from a paste of this form, the paste may be heated to a point at which substantially only the binder particles melt, but not the filler particles. Thus, if solder is used as the binder particles, heat is applied until the solder is reflown. Preferably, the proportion of binder particles to filler particles is such that as the binder particles melt, there is not sufficient liquidous to flow but there is sufficient liquidous to fuse/glue the filler particles together to form an integral structure. Accordingly, by forming the paste in this fashion, the paste moves very little and substantially retains its shape during reflow, thereby resulting in a solidified structure that has substantially the same shape as the deposited paste.

Notably, a paste that includes a mixture of binder particles and filler particles as described above allows for the formation of very large and tall structures of desired shapes and sizes, for example. Accordingly, a past of this form allows for the formation of a very localized heat spreader atop a give trace. In addition, because a paste of this form moves very little during the reflow process, a given resulting heat spreader may have a relatively consistent thickness/shape over the coverage area.

Referring to FIG. 1B there is illustrated a side perspective view of example heat spreader 120 formed using a paste that includes binder and filler particles. As shown, by using a paste of this type, the heat spreader may be formed, for example, to have a cube like shape with a relatively flat top surface and relatively flat side surfaces. As also shown, the heat spreader may be formed to have a substantial height, thereby creating a more localized heat spreader. For example, the heat spreader may extend substantially above the top surface of solder mask 106 and in particular, may have a thickness that is about eight times thicker than a one ounce copper trace on which the heat spreader is formed, for example.

In order to form heat spreaders 120-123 from paste of the above described form, the paste may be first deposited atop the traces, through openings formed in solder mask 106, using standard stencil printing technology, such as printing through a patterned stainless stencil or the like. Here, the stencil may be patterned to correspond to the desired size, shape, and location of the heat spreaders. Notably, because the paste substantially retains its form/shape during the reflow process, the stencil may be thick, thereby allowing for the formation of tall heat spreaders. Alternatively, rather than using stencil printing technology, the paste may be applied by dispensing the material through a dispense needle or tool. Thereafter, the paste may be passed through an elevated temperature profile to cause the binder particles to melt (e.g., if solder is used as the binder, heat is applied until the solder is reflown). As a result of heating the paste, heat spreaders 120-123 are formed.

As an example, a paste that includes a mixture of binder particles and filler particles as described above may have a form as disclosed in U.S. Publication No. US 2005/0093164 (U.S. patent application Ser. No. 10/970,165), entitled "Paste for Forming an Interconnect and Interconnect Formed From the Paste," by Martin Standing, and assigned to the assignee of the present application. The contents of U.S. Publication No. US 2005/0093164 are hereby incorporated by reference as if fully set forth in its entirety herein.

According to another embodiment of the invention, the paste used to form heat spreaders 120-123 may be a solder paste of any type known in the art that does not include filler particles as described above. As an example, the solder paste may be "board-attach solder paste" that is used to adhere devices, such as devices 108-111, to traces 104a-104d. In particular, the solder paste may be tin-lead solder, tin-silver solder, tin-silver-copper solder, or high lead solder. Printing techniques like those described above may be used to form heat spreaders 120-123 from a solder paste.

It should be noted that one limitation to forming heat spreaders 120-123 from a solder paste that does not include filler particles as described above is that solder paste tends to move during the reflow process and also tends to pull into a "domed" cross section as the paste is reflown. Notably, one result of this movement is that the solder paste may "pool" while in the molten state, thereby resulting in any given heat spreader having an inconsistent thickness across the surface thereof.

Advantageously, by forming the heat spreaders of the present invention from a paste of any of the above described forms, the heat spreaders do not require an intermediate adhesive or mechanical mechanism to secure the heat spreaders to the traces. In addition, the stencil and dispense methods of application for example, allow for the selective and localized formation of heat spreaders and allow for the formation of highly flexible and complex heat spreader designs. For example, as described above, the paste may be used to form heat spreaders that are able to guide the heatflow path towards cooler areas of a circuit board and away from hotspots.

Assuming heat spreaders 120-123 are formed from a paste that includes a mixture of binder and filler particles (hereinafter referred to as a "binder-filler based paste"), in an example method according to an embodiment of the invention circuit board 100 may be formed by first stencil printing atop traces 104a-104d board attach solder paste for devices 108-111. As an example, this stencil may have a thickness of about 6 mil. Thereafter, the binder-filler based paste may be stencil printed atop traces 104a-104d in order to form heat spreaders 120-123. As an example, the stencil used to deposit the binder-filler based paste may have a thickness of about 10 mil. and may have its underside etched to provide clearance for the already deposited board attach solder paste. Thereafter, using pick and place equipment, devices 108-111 may be placed onto the board attach solder paste. Finally, both the board attach solder paste and the binder-filler based paste may be reflown at the same time, thereby securing devices 108-111 to traces 104a-104d and thereby forming heat spreaders 120-123 atop the traces.

In another example method according to an embodiment of the invention, rather than using stencil printing to apply the binder-filler based past, this paste may be applied using a dispense needle or tool. This alternative method may be necessary, for example, when devices have already been placed onto circuit board 100. Here, the dispense needle or tool may be used to apply the binder-filler based past between the devices. Thereafter, the binder-filler based past may be reflowed, either at the same time as the board attach solder paste or in additional process.

Figure 2A:
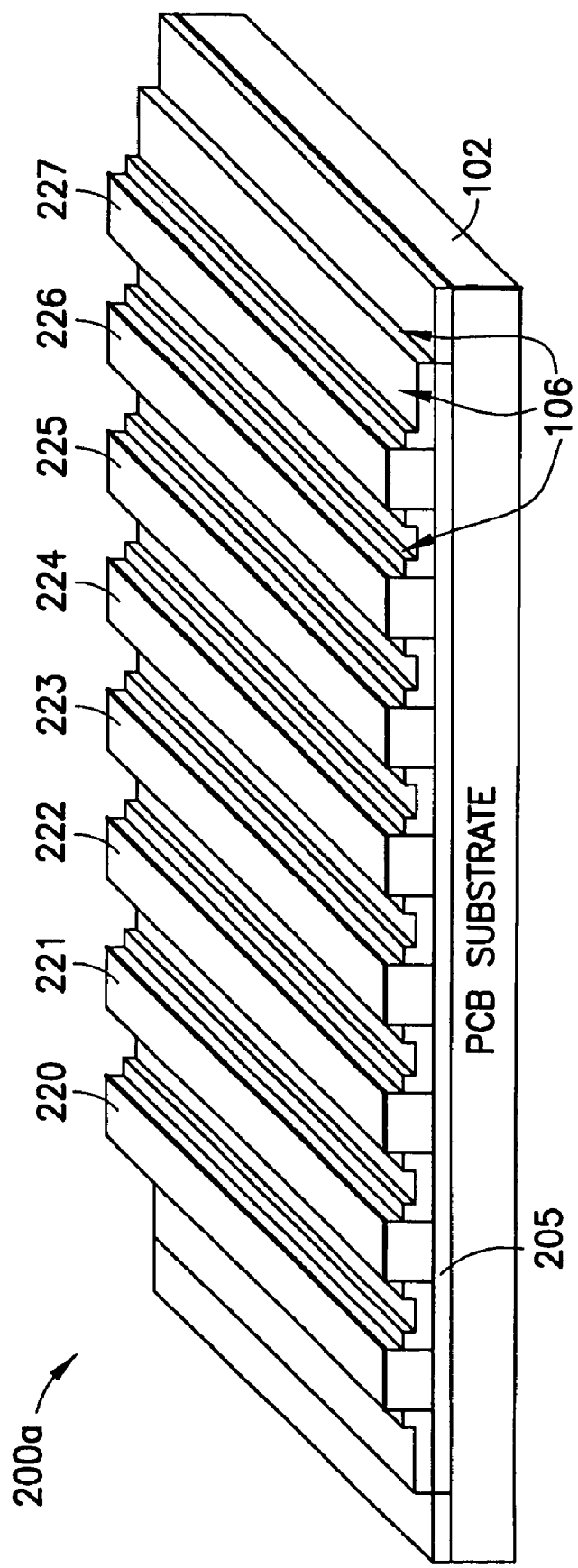
FIG. 2A shows a side perspective view of a portion of a circuit board that includes a plurality of heat spreaders according to another embodiment of the invention, the heat spreaders being configured to improve heat dissipation from the circuit board.

Referring now to FIG. 2A, there is shown a side perspective view of a portion of circuit board 200a according to another embodiment of the invention. Circuit board 200a is similar to circuit board 100 and includes a substrate 102. Formed on the top surface of substrate 102 are one or more traces made of copper or the like, such as trace 205. Again, one skilled in the art will recognize that circuit board 200a may also include intermediate traces formed within the substrate and/or traces formed on the bottom surface of the substrate. Circuit board 200a may also include a solder mask layer 106 formed over the top surface of substrate 102 and over portions of the top surfaces of the traces, as shown with trace 205. Although not shown in FIG. 2A, circuit board 200 may further include one or more devices of any type.

According to this embodiment of the invention, circuit board 200a also includes one or more heat spreaders formed atop one or more of the traces along the top surface of the board, such as heat spreaders 220-227 shown atop trace 205. One skilled in the will recognize that if circuit board 200a also includes traces along the bottom surface thereof, heat spreaders of the present invention may also be formed atop one or more of these traces.

According to this embodiment of the invention, heat spreaders 220-227 are formed of a thermally, and possibly electrically, conductive material that supplements the amount of high thermal conductivity material constituting trace 205, as similarly described above for traces 120-123. However, according to this embodiment of the invention, the heat spreaders are now arranged and configured to increase the overall surface area of the trace, thereby increasing the overall surface area of the circuit board and thereby allowing the circuit board to dissipate more heat to the surrounding area than would otherwise be possible. Specifically, as described above, in addition to the traces of a circuit board dissipating heat away from devices and across a circuit board, the circuit board in general is used to dissipate heat to the surrounding area. Again, the larger the circuit board area the more heat that may be dissipated. As indicated, a circuit board may be sized to obtain adequate heat dissipation for the devices mounted thereon. However, at times it may not be possible to adequately size a circuit board to obtain the necessary heat dissipation, for example. According to this embodiment of the invention, heat spreaders, such as heat spreaders 220-227, are formed on one or more traces to increase the overall surface area of the traces. By increasing the surface area of the traces, the surface area of the circuit board is increased and more heat may be dissipated to the surrounding area.

According to an embodiment of the invention, the heat spreaders formed atop the traces may be formed in a localized and selective fashion, thereby locally and selectively increasing the surface area of the circuit board. Accordingly, the heat spreaders may be formed along selective ones of the traces. For example, as shown by heat spreaders 220-227 in FIG. 2A, the heat spreaders may be formed along the surface area of a given trace in those areas that are free of devices. Alternatively, the circuit board may have one or more traces formed thereon that are directed only at heat dissipation and have no devices mounted thereon. Here, heat spreaders of the present invention may be formed substantially along the entire surfaces of such traces.

According to an embodiment of the invention, the heat spreaders formed atop the traces may be shaped/patterned in any desired form and in particular, are preferably shaped/patterned so as to increase the overall surface area of the traces. For example, a given trace may have a single heat spreader of either a geometric or non-geometric shape. Alternatively, as shown by heat spreaders 220-227 in FIG. 2A, a given trace may have a plurality of heat spreaders formed thereon. These plurality of heat spreaders may be formed in geometric patterns, such as spaced strips arranged in a straight parallel pattern, as shown in FIG. 2A. Nonetheless, other patterns may be used, such as a plurality of heat spreaders arranged in a curved pattern, a circular pattern, or a non-geometric pattern. One skilled in the art will also recognize that other shapes and patterns may be used.

According to an embodiment of the invention, heat spreaders 220-227 may be formed from materials as similarly described above for heat spreaders 120-123. In particular, heat spreaders 220-227 may be formed from a paste, including a paste that includes a mixture of binder and filler particles or any solder paste, such as board-attach solder paste, known in the art that does not include filler particles. When forming the heat spreaders from a paste, the heat spreaders may be formed using the same techniques and processes as described above. Notably, one advantage to using a paste that includes binder and filler particles as compared to a solder paste that does not include filler particles is that the former allows for heat spreaders having a more "square-like" cross sectional shape whereas the latter may tend to form heat spreaders having a more dome-like cross section. The more "square-like" cross sectional shape allows for greater exposed surface area and thereby more heat dissipation.

Using FIG. 2A as an example, trace 205 may be a 7.5 mm wide copper trace and heat spreaders 220-227 may be formed from a paste that includes binder and filler particles. These heat spreaders may be configured on a 0.5 mm pitch and may have a height of 200 um, a width of 0.5 mm, and a length that extends the full length of the trace 205. In this example configuration, heat spreaders 220-227 may increase the surface area of trace 205 by about 42%.

Figure 2B:
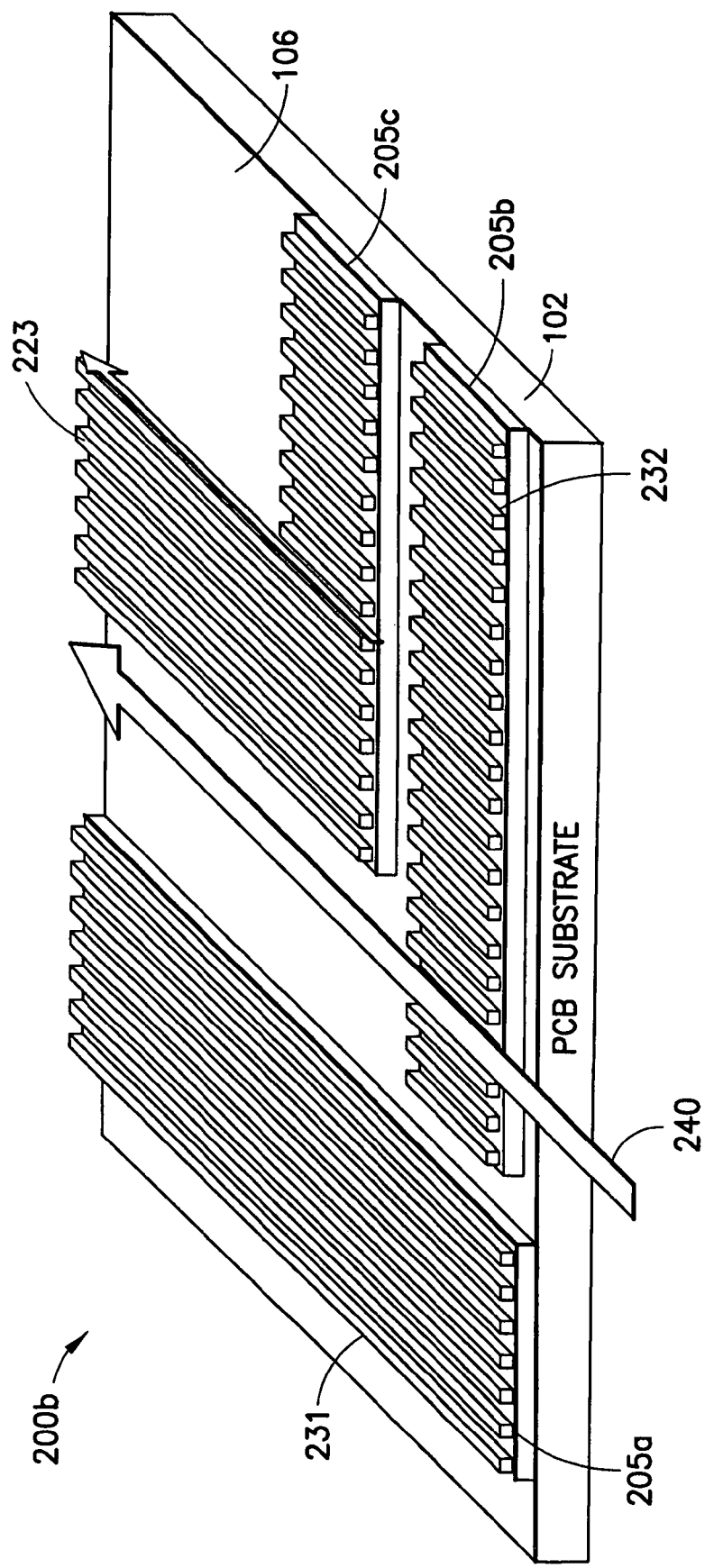
FIG. 2B shows a side perspective view of a portion of a circuit board that includes a plurality of heat spreaders according to another embodiment of the invention, the heat spreaders being configured to improve heat dissipation from the circuit board and being aligned with a directional air flow.

Referring now to FIG. 2B, there is shown a side perspective view of a portion of a circuit board 200b according to an embodiment of the invention. Circuit board 200b includes one or more traces on a top surface thereof, such as traces 205a-205c. Atop one or more of the traces are a plurality of heat spreaders, such as heat spreaders 231 atop trace 205a, heat spreaders 232 atop trace 205b, and heat spreaders 233 atop trace 205c. Heat spreaders 231-233 may be formed as similarly described above for heat spreaders 220-227 of FIG. 2A.

According to this embodiment of the invention, heat spreaders 231-233 are configured and arranged so as to align with airflow 240, which may be created by forced air cooling. Again, one skilled in the art will recognize that while FIG. 2B shows heat spreaders 231-233 arranged in strips of straight parallel patterns, any patterns and shapes may be used including curved patterns, circular patterns, and non-geometric patterns. One skilled in the are will also recognize that when a circuit board includes multiple heat spreaders atop different traces like that shown in FIG. 2B, the heat spreaders atop the different traces may have different shapes and patterns.

Referring now to FIG. 3, there is shown a side view of a portion of circuit board 300 according to another embodiment of the invention. Circuit board 300 includes a substrate 102 that has on the top surface thereof, for example, one or more traces, such as trace 305. Circuit board 300 also includes one or more devices of any type mounted thereon, such as device 308. According to this embodiment of the invention, circuit board 300 also includes one or more heat spreaders, such as heat spreader 310. Heat spreader 310 is disposed between trace 305 and device 308 and functions as both a micro heat sink for device 308, drawing heat away from the device, and also as a heat spreader, to reduce the formation of a hot spot around device 308.

According to an embodiment of the invention, heat spreader 310 may be formed from a paste, including a paste that includes a mixture of binder and filler particles or alternatively, any solder paste known in the art that does not include filler particles, as described above. The heat spreader may be formed using the same techniques and processes as described above for heat spreaders 120-123. Accordingly, one or more heat spreaders of the present embodiment may be formed in a selective and localized fashion atop a circuit board for those devices that may generate substantial heat, for example.

As indicated, device 308 is mounted atop heat spreader 310. As an example, device 308 may have one or more electrodes along surface 308a, thereby electrically conducting through heat spreader 310 to reach trace 305. As another example, surface 308a of device 308 may be electrically non-conductive, like a flip-chip device.

As shown in FIG. 3, heat spreader 310 may be larger than device 308 so that the heat spreader extends laterally beyond a perimeter of device 308 along one or more sides of the device. One skilled it the art will also recognize, however, that other configurations are possible. One skilled it the art will recognize that heat spreader 310 may be enlarged to support more than one device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A circuit board comprising:
   a substrate;
   a trace formed on said substrate and having a first major surface;
   a semiconductor device in thermal contact with said first major surface of said trace;
   a heat spreader formed of a solidified paste and disposed on a portion of said first major surface of said trace laterally displaced from said semiconductor device, wherein said heat spreader is configured to increase a cross sectional area of said portion of said trace to increase a conduction of heat generated by said semiconductor device along said portion of said trace; and
   wherein said paste includes a binder comprised of metallic solder and wherein said paste includes electrically conductive filler particles, and wherein said thermal contact includes an electrode of said semiconductor device in electrical contact with said trace or a surface of said semiconductor device directly mounted to said trace.

2. The circuit board of claim 1, wherein a top surface of said heat spreader is exposed.

3. The circuit board of claim 1, wherein said heat spreader has a substantially constant thickness.

4. The circuit board of claim 1, wherein said heat spreader has substantially flat top and side surfaces.

5. The circuit board of claim 1, wherein said heat spreader includes a plurality of heat spreaders.

6. The circuit board of claim 5, wherein said plurality of heat spreaders are substantially parallel.

7. The circuit board of claim 1, wherein said heat spreader is configured to prevent a hot spot from forming in an area of said trace surrounding said semiconductor device.

8. The circuit board of claim 1, wherein said heat spreader is configured to directionally guide said heat along said trace.

9. The circuit board of claim 1, wherein said heat spreader is self-adhering to said trace.

10. The circuit board of claim 1, wherein said metallic solder is comprised of tin-lead solder.

11. The circuit board of claim 1, wherein said metallic solder is comprised of tin-silver solder.

12. The circuit board of claim 1, wherein said solder is comprised of tin-silver-copper solder.

13. The circuit board of claim 1, wherein said conductive filler particles are comprised of one of copper, nickel, and tin-silver.

* * * * *